United States Patent
Mitani et al.

(10) Patent No.: US 7,192,479 B2
(45) Date of Patent: Mar. 20, 2007

(54) LASER ANNEALING MASK AND METHOD FOR SMOOTHING AN ANNEALED SURFACE

(75) Inventors: Yasuhiro Mitani, Vancouver, WA (US); Apostolos T. Voutsas, Vancouver, WA (US); Mark A. Crowder, Portland, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 462 days.

(21) Appl. No.: 10/124,826

(22) Filed: Apr. 17, 2002

(65) Prior Publication Data

US 2003/0196589 A1 Oct. 23, 2003

(51) Int. Cl.
*H01L 21/322* (2006.01)

(52) U.S. Cl. .............. 117/2; 117/3; 117/4; 117/44; 117/47

(58) Field of Classification Search ............ 117/47, 117/2, 3, 4, 44
See application file for complete search history.

(56) References Cited

U.S. PATENT DOCUMENTS

| | | | | |
|---|---|---|---|---|
| 4,970,546 A | * | 11/1990 | Suzuki et al. ............ | 355/53 |
| 5,365,875 A | * | 11/1994 | Asai et al. ............... | 117/7 |
| 5,395,481 A | * | 3/1995 | McCarty .................. | 156/630 |
| 5,825,023 A | * | 10/1998 | Cai et al. ................ | 250/237 G |
| 6,322,625 B2 | | 11/2001 | Im .......................... | 117/43 |
| 6,777,276 B2 | * | 8/2004 | Crowder et al. ......... | 438/166 |
| 2004/0043606 A1 | * | 3/2004 | Crowder et al. ......... | 438/662 |

FOREIGN PATENT DOCUMENTS

WO    WO 97/45827    * 12/1997

* cited by examiner

Primary Examiner—Yogendra Gupta
Assistant Examiner—G. Nagesh Rao
(74) Attorney, Agent, or Firm—David C. Ripma

(57) ABSTRACT

A mask with sub-resolution aperture features and a method for smoothing an annealed surface using a sub-resolution mask pattern are provided. The method comprises: supplying a laser beam having a first wavelength; supplying a mask with a first mask section having apertures with a first dimension and a second mask section with apertures having a second dimension, less than the first dimension; applying a laser beam having a first energy density to a substrate region; melting a substrate region in response to the first energy density; crystallizing the substrate region; applying a diffracted laser beam to the substrate region; and, in response to the diffracted laser beam, smoothing the substrate region surface. In some aspects of the method, applying a diffracted laser beam to the substrate area includes applying a diffracted laser beam having a second energy density, less than the first energy density, to the substrate region. The second energy density is in the range of 40% to 70% of the first energy density, and preferably in the range of 50% to 60% of the first energy density.

22 Claims, 5 Drawing Sheets

LASER ANNEALING MASK AND METHOD FOR SMOOTHING AN ANNEALED SURFACE

BACKGROUND OF THE INVENTION

1. Field of the Invention

This invention generally relates to integrated circuit (IC) and liquid crystal display (LCD) fabrication and, more particularly, to a system and method for smoothing the surface of a crystallized substrate during a laser annealing process.

2. Description of the Related Art

When forming thin film transistors (TFTs) for use in LCD or other microelectronic circuits, the location of transistors channel regions, the orientation of regular structured polycrystalline silicon (poly-Si) or single-grain-crystalline silicon, and the surface roughness are important issues. This poly-Si material can be used as the active layer of poly-Si TFTs in the fabrication of active-matrix (AM) backplanes. Such backplanes can be used in the fabrication of AM LCDs and can be also combined with other display technologies, such as organic light-emitting diodes (OLEDs).

Poly-Si material is typically formed by the crystallization of initially deposited amorphous Si (a-Si) films. This process can be accomplished via solid-phase-crystallization (SPC), for example, by annealing the a-Si films in a furnace at appropriate temperature and for sufficiently long time. Alternatively, laser annealing can also be used to achieve the phase transformation.

Conventionally, crystallization techniques are applied to a substrate in such a manner as to yield uniform poly-Si film quality throughout the substrate area. In other words, there is no spatial quality differentiation over the area of the substrate. The most important reason for this end result is the inability of conventional methods to achieve such quality differentiation. For example, when a-Si film is annealed in a furnace or by rapid-thermal-annealing, all of the film is exposed to the same temperature, resulting in the same quality of poly-Si material. In the case of conventional laser annealing, some differentiation is possible, but the price, in terms of loss of throughput, is very high for the modest performance gains realized.

Recently, a new laser annealing technique has been developed that allows for significant flexibility in the process techniques, permitting controlled variation in resulting film microstructure. This technique relies on lateral growth of Si grains using very narrow laser beams, that are generated by passing a laser beam through a beam-shaping mask, and projecting the image of the mask to the film that is being annealed. The method is called Laser-Induced Lateral Growth (LILaC).

FIG. 1 is a diagram illustrating the LILaC process (prior art). The initially amorphous silicon film is irradiated by a very narrow laser beamlet, with typical widths of a few microns (i.e. 3–5 μm). Such small beamlets are formed by passing the original laser beam through a mask that has open spaces or apertures (see FIG. 2), and projecting the beamlets onto the surface of the annealed Si-film.

FIG. 2 is a conventional laser annealing mask (prior art). Returning to FIG. 1, the sequence of images 1 through 4 illustrates the growth of long silicon grains. A step-and-repeat approach is used. The shaped laser "beamlet" (indicated by the 2 parallel, heavy black lines) irradiates the film and then steps by a distance smaller than half of the width of the slit. As a result of this deliberate advancement of each beamlet, grains are allowed to grow laterally from the crystal seeds of the poly-Si material formed in the previous step. This is equivalent to laterally "pulling" the crystals, as in zone-melting-crystallization (ZMR) method or other similar processes. As a result, the crystal tends to attain very high quality along the "pulling" direction, in the direction of the advancing beamlets. This process occurs simultaneously at each slit on the mask, allowing for rapid crystallization of the area covered by the projection of the mask on the substrate. Once this area is crystallized, the substrate moves to a new (unannealed) location and the process is repeated.

FIG. 3 is a pictorial representation of a system to accomplish the optical projection and the step-and repeat process (prior art). The LILaC process has the potential for creating intentional spatial variations in the quality of the poly-Si material. Such intentional variations can be beneficial for applications where multiple components are integrated on a display, where each component has different specifications and material performance requirements.

Some poly-Si materials formed through the LILaC process have a highly periodical microstructure, where crystal bands of specific width are separated by high-angle grain boundaries. Within the crystal bands, low-angle boundaries are observed with a frequency of occurrence dependent upon certain specifics of the crystallization process, such as film thickness, laser fluence (energy density), pulse duration, and the like. TFTs fabricated on such poly-Si films demonstrate very good characteristics, as long as the direction of conduction is parallel to the direction of the in-crystal low-angle boundaries.

TFTs with greater electron mobility can be fabricated if the substrate crystallization characteristics can be made more isotropic. In other words, the TFT performance depends upon the angle between the main crystalline growth direction, the direction parallel to the laser scanning axis, and the TFT channel. This is due to the formation of sub-boundaries within the crystal domains. The surface roughness at the "hard" grain boundaries, at the edges of the crystal bands/domains, can be significant. This surface roughness prohibits the reduction of the gate insulator thickness, which is one critical step for scaling down the device geometry for future applications. Further, not all these processes can be location controlled. Therefore, by chance only, depending upon the relative size of the crystal domain and the TFT channel length, certain TFTs will not include grain-boundaries in their active area (channel), whereas other TFTs will include one or more boundaries in their active areas. This kind of non-uniformity is highly detrimental for critical-application TFTs where uniformity of characteristics is more essential than absolute performance.

It would be advantageous if the LILaC process could be modified to include a process of smoothing the substrate surface after laser annealing.

It would be advantageous if the LILaC process could form TFT channel regions less dependent upon random process occurrences.

SUMMARY OF THE INVENTION

The present invention method is used for smoothing the surface roughness of a silicon substrate during the crystallization process, using a surface "smoothing" mask feature. Making the substrate surface smooth enables improved TFT performance, with a simultaneous improvement in TFT reliability. The present invention process doesn't add time-consuming additional steps to the LILaC process.

Accordingly, a method is provided for smoothing an annealed surface using a sub-resolution mask pattern. The method comprises: supplying a laser beam having a first wavelength; supplying a mask with a first mask section having apertures with a first dimension and a second mask section with apertures having a second dimension, less than the first dimension; applying a laser beam having a first energy density to a substrate region; melting a substrate region in response to the first energy density; crystallizing the substrate region; applying a diffracted laser beam to the substrate region; and, in response to the diffracted laser beam, smoothing the substrate region surface.

In some aspects of the method, applying a diffracted laser beam to the substrate area includes applying a diffracted laser beam having a second energy density, less than the first energy density, to the substrate region. The second energy density is in the range of 40% to 70% of the first energy density, and preferably in the range of 50% to 60% of the first energy density.

In some aspects, supplying a laser beam having a first wavelength includes the first wavelength being less than, or equal to the first dimension, and greater than the second dimension. Then, approximately 100% of the supplied laser beam is transmitted through the first mask region, while applying a diffracted laser beam having a second energy density, less than the first energy density, to the substrate region includes transmitting less than 100% of the supplied laser beam through the second mask region.

Additional details of the above-described method and a laser annealing mask with sub-resolution aperture patterns are described below.

DETAILED DESCRIPTION OF THE PREFERRED EMBODIMENTS

Figure 1:
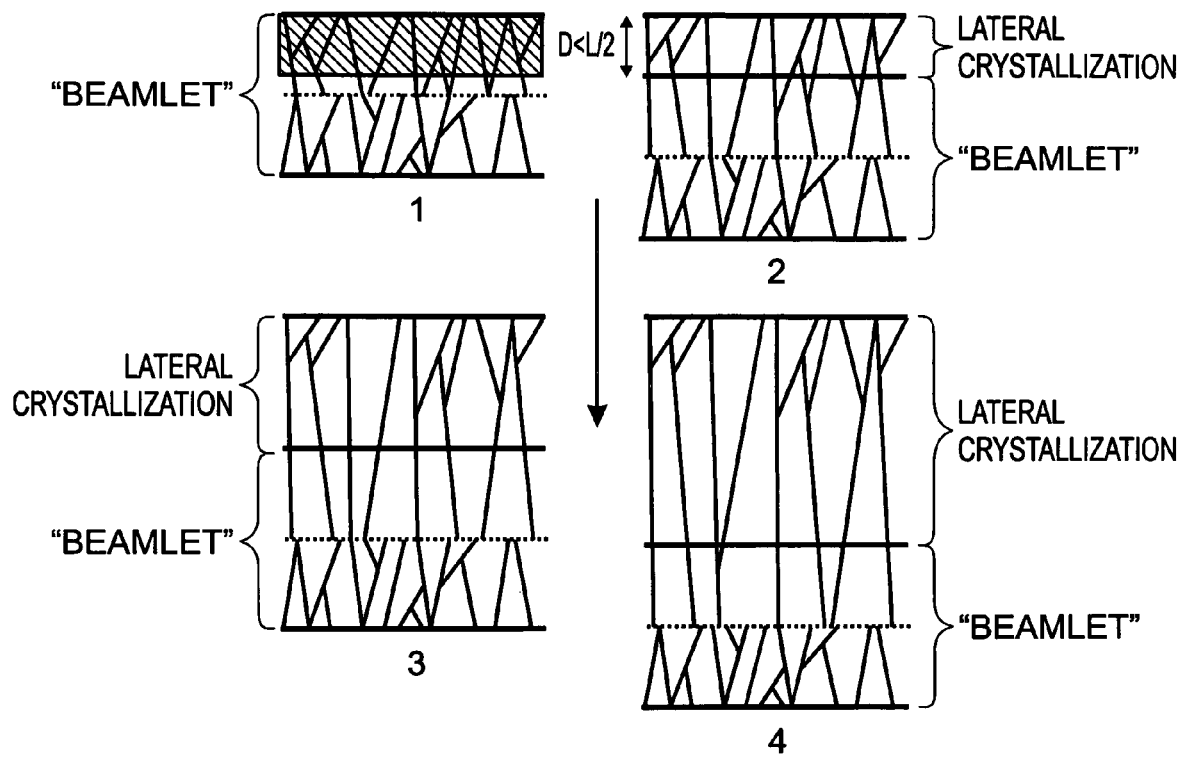
FIG. 1 is a diagram illustrating the LILaC process (prior art).
Figure 2:
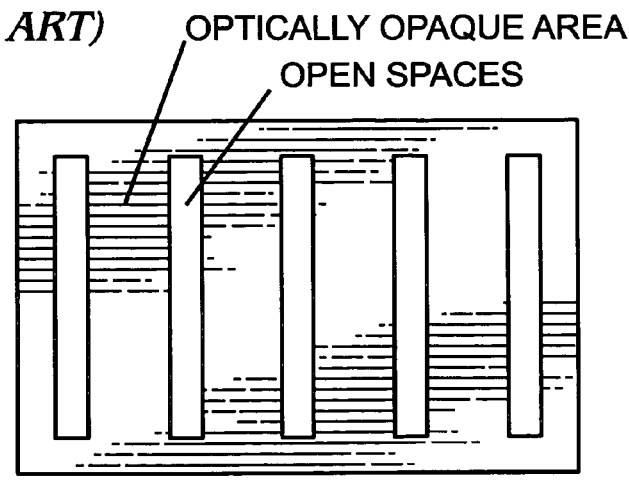
FIG. 2 is a conventional laser annealing mask (prior art).
Figure 3:
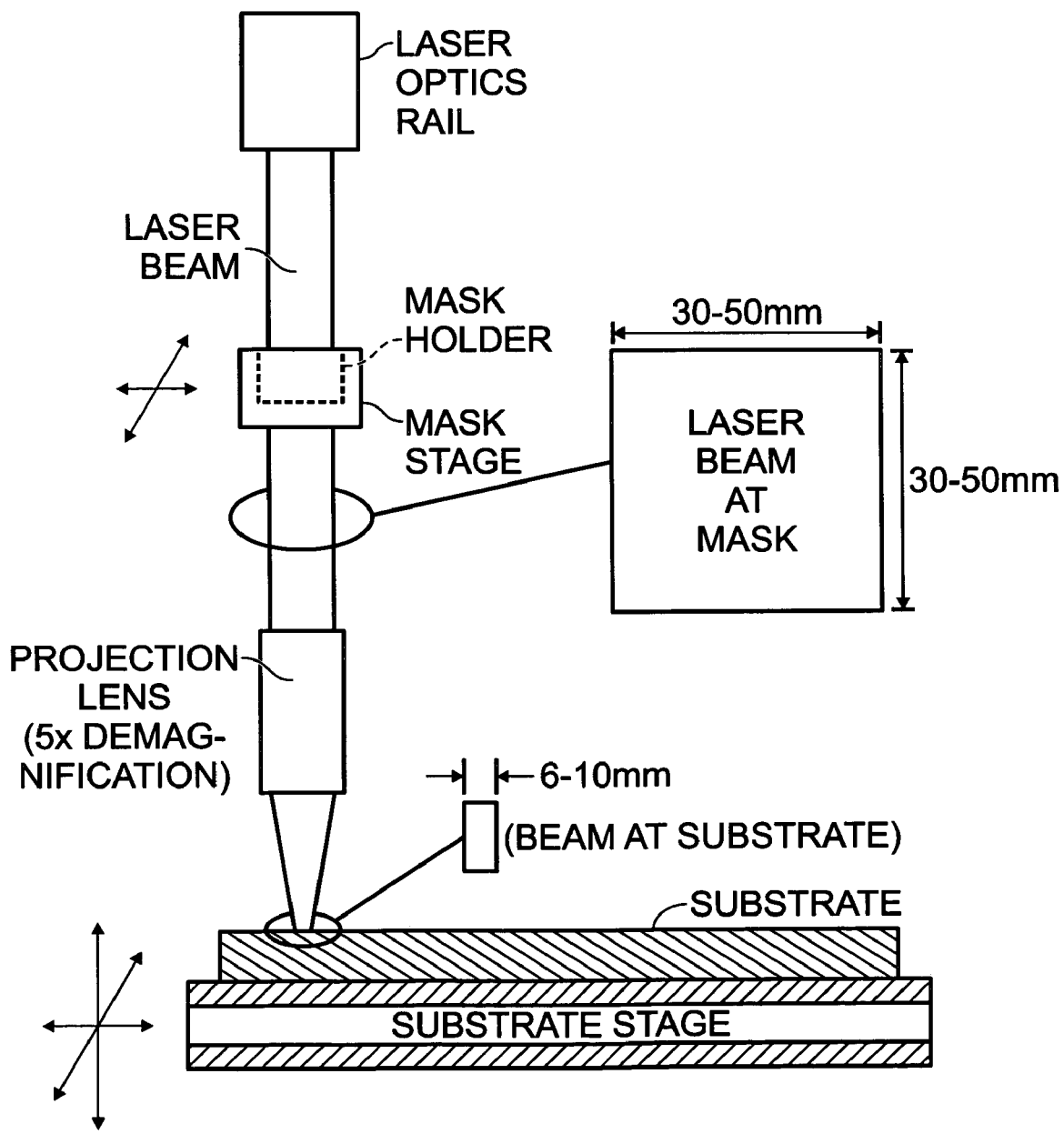
FIG. 3 is a pictorial representation of a system to accomplish the optical projection and the step-and repeat process (prior art).
Figure 4:
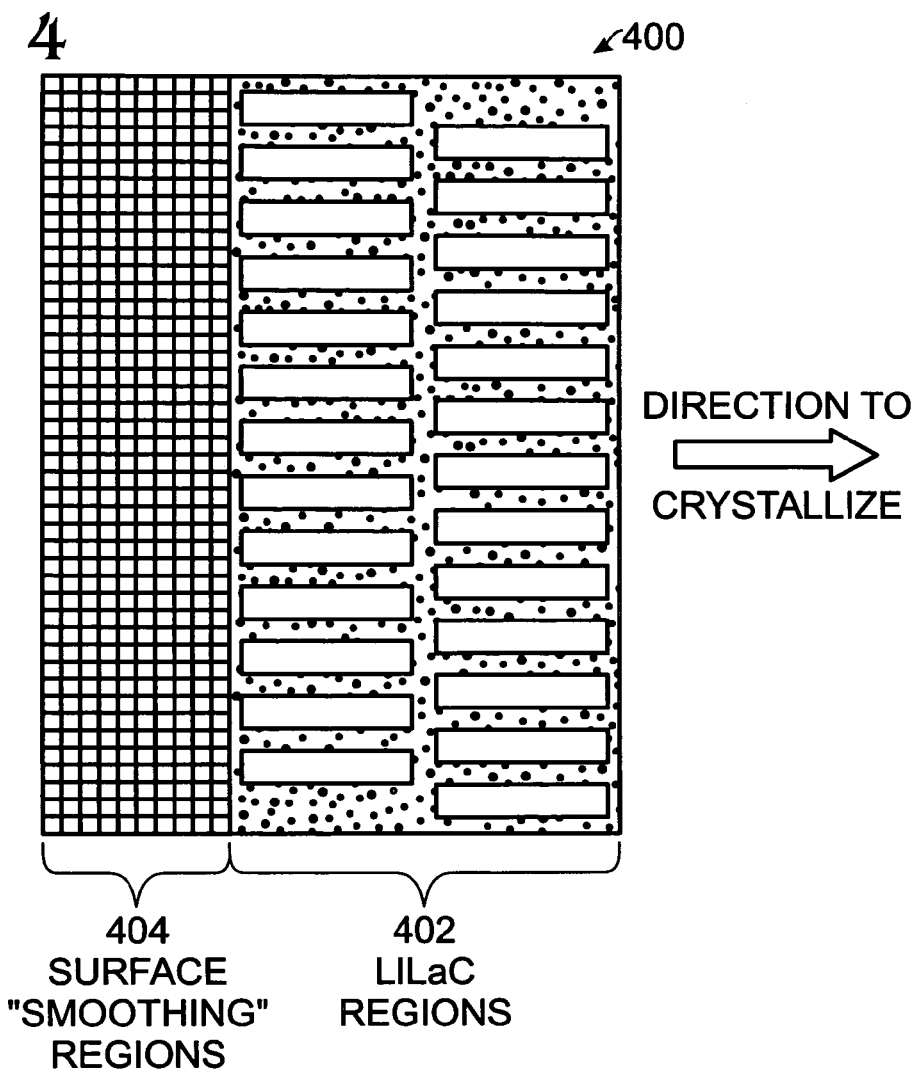
FIG. 4 is a plan view of the present invention laser annealing mask with sub-resolution aperture patterns.

FIG. 4 is a plan view of the present invention laser annealing mask with sub-resolution aperture patterns. The mask 400 comprises at least one section 402 with aperture patterns for transmitting approximately 100% of incident light, and at least one section 404 with aperture patterns for diffracting incident light.

Figure 5:
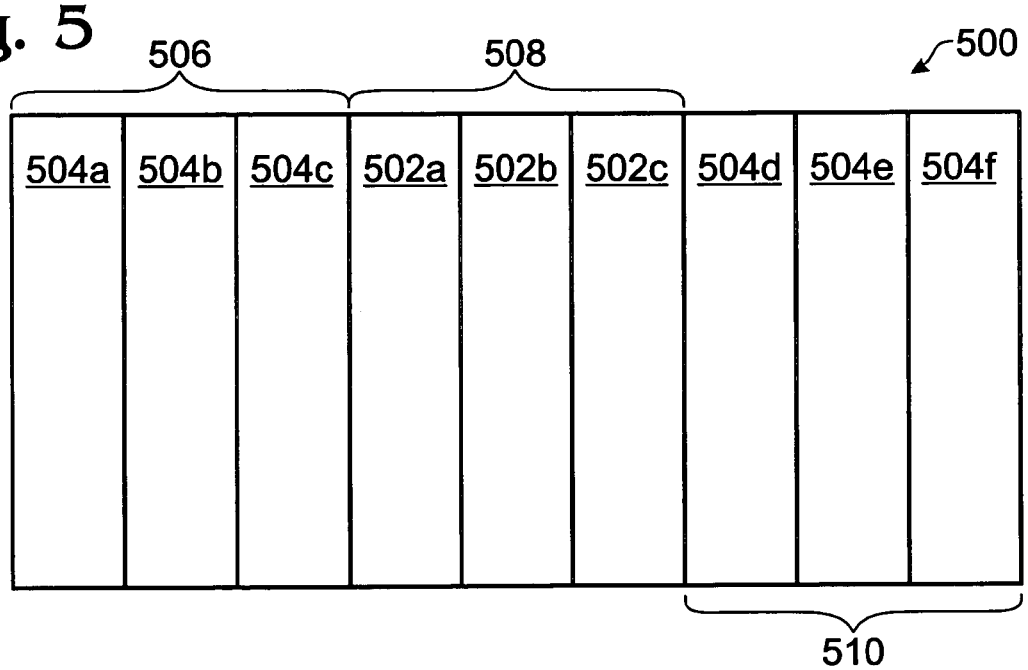
FIG. 5 depicts a variation of the sub-resolution mask of FIG. 4.

FIG. 5 depicts a variation of the sub-resolution mask of FIG. 4. As shown, mask 500 comprises a plurality of adjacent 100% transmission sections 502a, 502b, and 502c with aperture patterns for transmitting approximately 100% of incident light. Also shown, the mask 500 includes a plurality of adjacent sections 504a through 504f with aperture patterns for diffracting incident light. The number of adjacent 100% transmission sections typically varies between 2 and 5 (three are shown), although the present invention is not limited to any particular number. Likewise, the number of adjacent diffracting sections typically varies between 2 and 5. Such a mask would be useful in smoothing a laser annealed surface, regardless of the direction of mask with respect to the underlying substrate.

More specifically, a first set 506 of a plurality of adjacent sections with aperture patterns for diffracting incident light is shown with a second set 508 of a plurality of adjacent sections with aperture patterns for transmitting approximately 100% of incident light, adjacent the first set 506. A third set 510 of a plurality of adjacent sections with aperture patterns for diffracting incident light is adjacent the second set 508. As mentioned above, the first and third sets 506 and 510 typically include between 2 and 6 adjacent sections. Three adjacent sections are shown in each set.

Figure 6A:
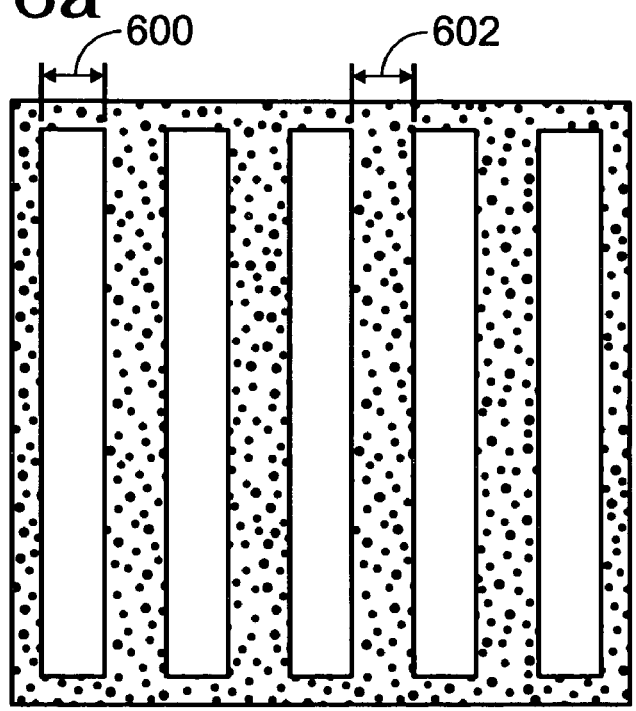
FIGS. 6a and 6b depict mask diffraction sections.
Figure 6B:
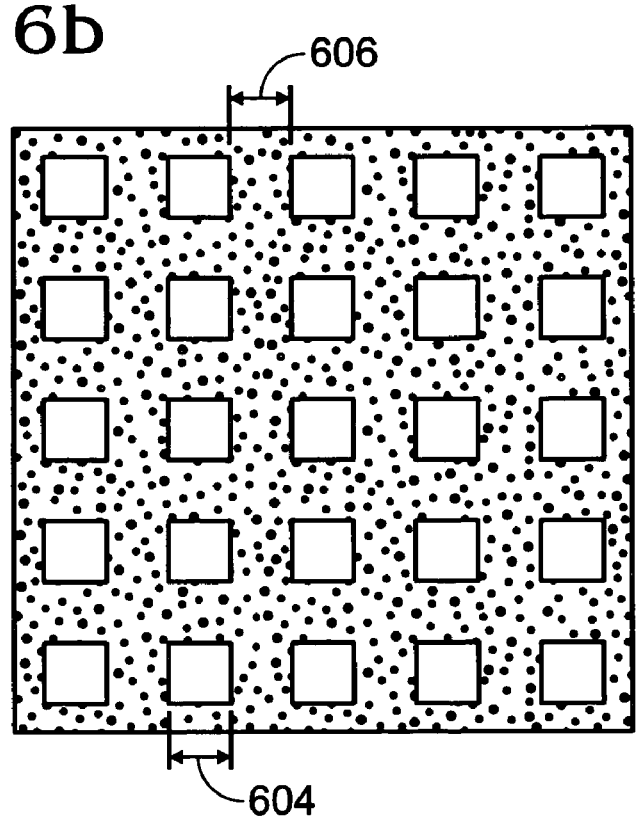

FIGS. 6a and 6b depict mask diffraction sections. In some aspects, the mask includes aperture patterns for diffracting incident light formed as a plurality of line pattern apertures, as shown in FIG. 6a. The line pattern apertures includes a spacing between lines (slits) 600 in the range between 0.25 microns and 1.5 microns, and line widths 602 in the range of 0.25 microns and 1.5 microns.

Alternately, as shown in FIG. 6b, the aperture patterns for diffracting incident light includes a plurality of square spaced apertures with square sides 604 in the range between 0.25 microns and 1.5 microns. Likewise, the sections between the aperture squares has a spacing 606 in the range between 0.25 microns and 1.5 microns. Other variations not shown would form the aperture patterns as rectangles or circles. Note, mask sections that transmit approximately 100% of incident light are well known. Any of these conventional types of mask sections can be used with the present invention sub-resolution mask.

The wavelength of light defines the ideal minimum mask aperture dimension that can completely pass a particular monochromatic beam of light. However, this klimit is only theoretical, as the resolution is actually limited by diffraction effects. In other words, as light passes through a mask that has patterns of certain dimensions, diffraction will occur. The diffraction generates a multitude of beamlets that propagate at various angles around a direction normal to the mask, determined by the Bragg's formula. If the projection lens (under the mask) could collect all of these beams then, in theory, it would be able to perfectly resolve the features of the mask. This "collection efficiency" is actually expressed by the numerical aperture (NA) of the lens—the higher NA is, the wider the collection angle is, hence, the higher the resolution of the optical system.

As the feature size on the mask becomes smaller, that is, gets closer and closer to the wavelength of the light source, a higher collection efficiency is needed to resolve the pattern. Hence, a higher NA is required. Therefore, if the NA lens remains constant as the mask features become smaller, the light becomes diffracted. The result is a "blurred" pattern. The beam does not resolve the pattern because it is diffraction limited.

Each mask section with aperture patterns for transmitting approximately 100% of incident light can be said to transmit a first energy density, or first fluence. Each mask section with aperture patterns for diffracting incident light can be said to transmit a second energy density, or second fluence, less than the first energy density. In some aspects, mask sections with aperture patterns for diffracting incident light transmits a second energy density that is 40% to 70% of the first energy density. Preferable, the second energy density is 50% to 60% of the first energy density.

Functional Description

The present invention method is simple and involves addition of "smoothing" regions at the edges of a standard LILaC mask. The smoothing regions are areas that are designed to intentionally diffract the beam and, consequently, reduce the laser fluence that reaches the surface of the substrate. With this configuration, the film is initially completely melted, to induce lateral growth, and then is only partially melted to promote surface reflow and smoothing of the ridges that develop at the points of congruence of grain boundaries.

The design of the smoothing region of the mask can be accomplished by simulation of the optical properties of this region using appropriate software (i.e. SPLAT). The mask form of the smoothing regions is designed to irradiate the area on the substrate with the uniform fluence. The region of surface roughness is irradiated with less fluence than the fluence of the LILaC crystallization. But, the mask diffraction sections are not limited to the examples described above. Other patterns besides slits and squares can cause diffraction. Further, a filter can be used to reduce irradiation fluence. It should also be understood that the dimensions of the diffraction section apertures are dependent upon conditions such as the wavelength of the laser, the specification of optics, and the NA, to name a few examples.

Figure 7:
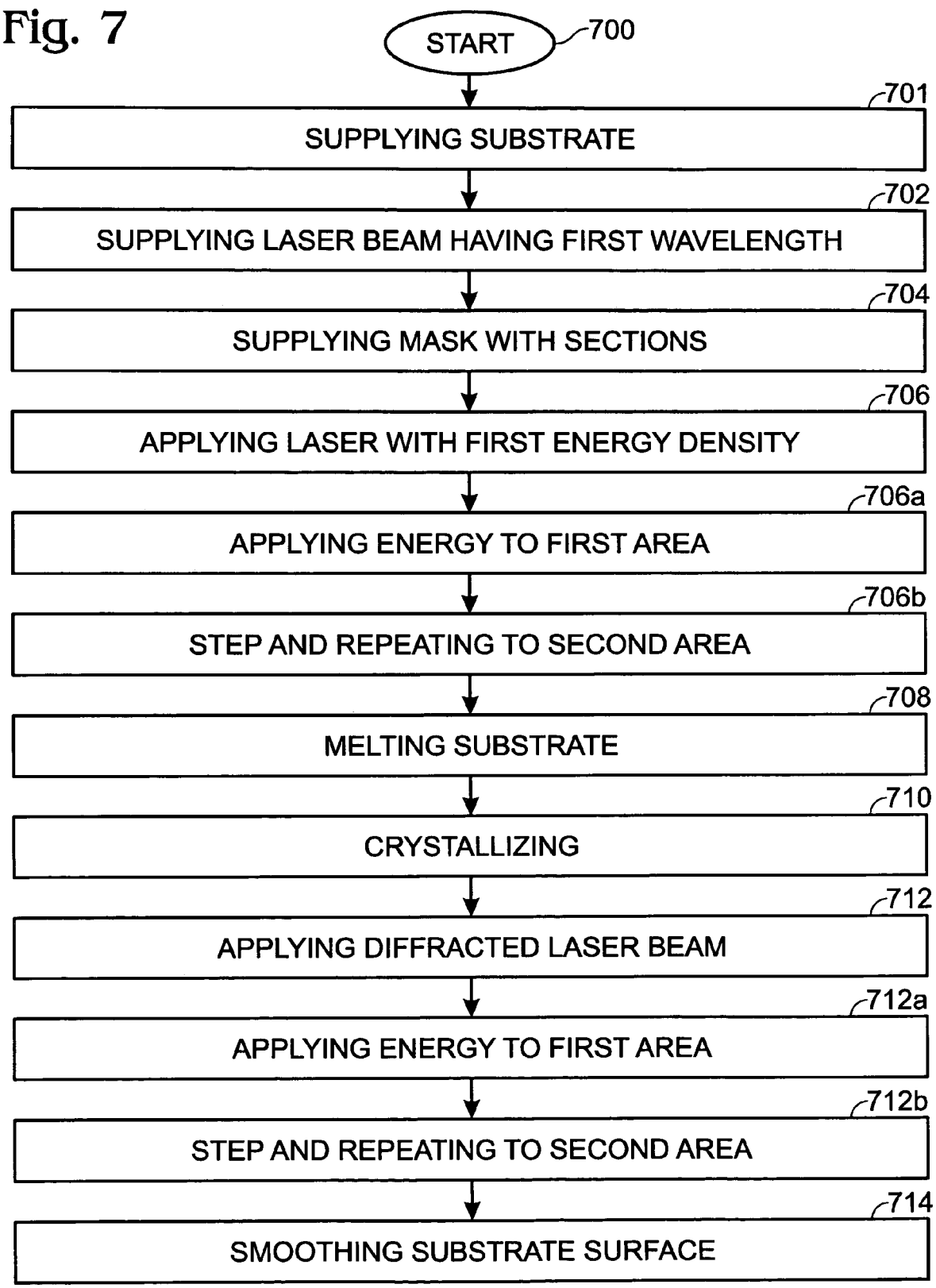
FIG. 7 is a flowchart illustrating the present invention method for smoothing an annealed surface using a sub-resolution mask pattern.

FIG. 7 is a flowchart illustrating the present invention method for smoothing an annealed surface using a sub-resolution mask pattern. Although this method is depicted as a sequence of numbered steps for clarity, no order should be inferred from the numbering unless explicitly stated. It should be understood that some of these steps may be skipped, performed in parallel, or performed without the requirement of maintaining a strict order of sequence. The methods start at Step 700. Step 702 supplies a laser beam having a first wavelength. Step 704 supplies a mask with a first mask section having apertures with a first dimension and a second mask section with apertures having a second dimension, less than the first dimension. Step 706 applies a laser beam having a first energy density to a substrate region. Step 708 melts a substrate region in response to the first energy density. Step 710 crystallizes the substrate region. Step 712 applies a diffracted laser beam to the substrate region. Step 714, in response to the diffracted laser beam, smoothes the substrate region surface. In some aspects Step 714 includes melting the substrate region surface to a thickness in the range of 200 Å to 300 Å. Alternately, Step 701 supplies a substrate film having a first thickness. Then, smoothing the substrate surface in Step 714 includes melting approximately 50% of the substrate film first thickness.

In some aspects of the method, applying a diffracted laser beam to the substrate area in Step 712 includes applying a diffracted laser beam having a second energy density, less than the first energy density, to the substrate region. Typically, the second energy density is in the range of 40% to 70% of the first energy density. Preferably, the second energy density is in the range of 50% to 60% of the first energy density.

In other aspects, supplying a laser beam having a first wavelength in Step 702 includes the first wavelength being less than, or equal to the first dimension, and greater than the second dimension. Applying a laser beam having a first energy density to a substrate region in Step 706 includes transmitting approximately 100% of the supplied laser beam through the first mask region. Then, applying a diffracted laser beam having a second energy density, less than the first energy density, to the substrate region in Step 712 includes transmitting less than 100% of the supplied laser beam through the second mask region.

In some aspects, applying a laser beam having a first energy density to a substrate region in Step 706 includes substeps. Step 706*a* applies the first energy density to a first area in the substrate region. Step 706*b* step-and-repeats the application of the first energy density to a second area in the substrate region adjacent the first area. Likewise, applying a diffracted laser beam having a second energy density to the substrate region in Step 712 includes substeps. Step 712*a* applies the second energy density to the first area. Step 712*b* step-and-repeats the application of the second energy density to the second area.

In other aspects, supplying a mask with a second mask section with apertures having a second dimension in Step 704 includes supplying a second mask section with a line pattern of apertures. Typically, the second mask section with a line pattern of apertures includes the spacing between lines being in the range between 0.25 microns and 1.5 microns, and the line widths being in the range of 0.25 microns and 1.5 microns.

Alternately, supplying a mask with a second mask section with apertures having a second dimension in Step 704 includes supplying a second mask section with a square spaced pattern of apertures. Typically, the second mask section with the square spaced pattern of apertures includes the square sides being in the range between 0.25 microns and 1.5 microns, and sections between the aperture squares in the range between 0.25 microns and 1.5 microns.

A mask with sub-resolution aperture features and a method for using such a mask to smooth substrate surfaces as part of a laser annealing process have been described. A few examples have been given as to how such a mask could fabricated, but the present invention is not limited to just these examples. Likewise, an exemplary annealing process has been presented, but other variations of such a process are also practical. Other variation and embodiments of the invention will occur to those skilled in the art.

We claim:

1. A method for smoothing an annealed surface using a sub-resolution mask pattern, the method comprising:
   applying a laser beam having a first energy density to a substrate region;
   melting the substrate region in response to the laser beam first energy density;
   crystallizing the substrate region;
   applying a laser beam to a mask with an aperture;
   incompletely resolving the light passing through the aperture with a lens;
   irradiating the substrate region with incompletely resolved light having a second energy density, less than the first energy density; and, in response to the incompletely resolved light, smoothing the substrate region surface.

2. The method of claim 1 wherein smoothing the substrate surface includes melting the substrate region surface to a thickness in the range of 200 Å to 300 Å.

3. The method of claim 1 wherein irradiating with incompletely resolved light includes the second energy density being in the range of 40% to 70% of the first energy density.

4. The method of claim 3 wherein irradiating with incompletely resolved light includes the second energy density being in the range of 50% to 60% of the first energy density.

5. The method of claim 1 further comprising:
   supplying a laser beam having a first wavelength;

supplying a mask with a first mask section having apertures with a first dimension and a second mask section with apertures having a second dimension, less than the first dimension.

6. The method of claim 5 wherein supplying a laser beam having a first wavelength includes the first wavelength being less than, or equal to the first dimension, and greater than the second dimension;
   wherein applying a laser beam having a first energy density to a substrate region includes transmitting approximately 100% of the supplied laser beam through the first mask region; and,
   wherein irradiating with incompletely resolved light having a second energy density includes applying less than 100% of the laser beam supplied to the second mask region.

7. The method of claim 6 wherein applying a laser beam having a first energy density to a substrate region includes:
   applying the first energy density to a first area in the substrate region;
   step-and-repeating the application of the first energy density to a second area in the substrate region adjacent the first area;
   wherein irradiating the substrate region with incompletely resolved light having a second energy density includes:
   applying the second energy density to the first area; and,
   step-and-repeating the application of the second energy density to the second area.

8. The method of claim 7 wherein supplying a mask with a second mask section with apertures having a second dimension includes supplying a second mask section with a line pattern of apertures.

9. The method of claim 8 wherein supplying a second mask section with a line pattern of apertures includes the spacing between lines being in the range between 0.25 microns and 1.5 microns, and the line widths being in the range of 0.25 microns and 1.5 microns.

10. The method of claim 7 wherein supplying a mask with a second mask section with apertures having a second dimension includes supplying a second mask section with a square spaced pattern of apertures.

11. The method of claim 10 wherein supplying a second mask section with the square spaced pattern of apertures includes the square sides being in the range between 0.25 microns and 1.5 microns, and sections between the aperture squares in the range between 0.25 microns and 1.5 microns.

12. The method of claim 3 further comprising:
   supplying a substrate film having a first thickness; and,
   wherein smoothing the substrate surface includes melting approximately 50% of the substrate film first thickness.

13. A method for smoothing an annealed surface substrate, the method comprising:
   applying a laser beam having a first energy density to a region of a substrate, and crystallizing the region of the substrate; and passing a laser beam through a sub-resolution mask with an aperture;
   accepting the light passing through the aperture at a lens;
   in response to the numerical aperture of the lens and the size of the aperture, generated unresolved optical images having a second energy density that is less than the first energy density; and unresolved optical images to the region as follows;
   partially melting the region of the substrate using the unresolved optical images; and crystallizing the partially melted region.

14. The method of claim 13, wherein partially melting the region of the substrate melts the region of the substrate to thickness in a range of about 200 Å to about 300 Å.

15. The method according to claim 13, wherein the second energy density is in a range of about 40% to about 70% of the first energy density.

16. The method according to claim 15, wherein the second energy density is in a range of about 50% to about 60% of the first energy density.

17. The method according to claim 13, wherein the sub-resolution mask includes at least one aperture having a size that is less than a wavelength of the laser beam.

18. The method according to claim 13, wherein the sub-resolution mask includes a line pattern of apertures, each aperture having a size that is less than a wavelength of the laser beam.

19. The method according to claim 18, wherein the line pattern of apertures has a spacing between each line of between about 0.25 microns and about 1.5 microns, and
   wherein each line of the line pattern of apertures has a width of about 0.25 microns and about 1.5 microns.

20. The method according to claim 13, wherein the sub-resolution mask includes a square-spaced pattern of apertures, each aperture having a size that is less than a wavelength of the laser beam.

21. The method according to claim 20, wherein each aperture of the square-spaced pattern of apertures has a size of between about 0.25 microns and about 1.5 microns, and
   wherein a spacing between each aperture of the square-spaced pattern of apertures is about 0.25 microns and about 1.5 microns.

22. The method according to claim 13, wherein the substrate is a film having a first thickness, and
   wherein smoothing the region of the substrate film melts about half of the thickness of the substrate film.

* * * * *